(12) United States Patent
Sakurada et al.

(10) Patent No.: US 10,407,775 B2
(45) Date of Patent: Sep. 10, 2019

(54) BASE PLATE, HARD DISK DRIVE, AND METHOD OF MANUFACTURING BASE PLATE

(71) Applicant: Nidec Corporation, Kyoto (JP)

(72) Inventors: Kunio Sakurada, Kyoto (JP); Tomohiro Yoneda, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 15/879,473

(22) Filed: Jan. 25, 2018

(65) Prior Publication Data

US 2019/0093234 A1 Mar. 28, 2019

(30) Foreign Application Priority Data

Sep. 22, 2017 (JP) ................................. 2017-181974

(51) Int. Cl.

| G11B 33/00 | (2006.01) |
|---|---|
| C23C 18/18 | (2006.01) |
| G11B 5/73 | (2006.01) |
| C23C 18/31 | (2006.01) |
| G11B 5/84 | (2006.01) |
| G11B 33/12 | (2006.01) |
| G11B 33/14 | (2006.01) |
| G11B 25/04 | (2006.01) |
| H05K 5/04 | (2006.01) |

(52) U.S. Cl.
CPC .......... *C23C 18/1803* (2013.01); *C23C 18/31* (2013.01); *G11B 5/73* (2013.01); *G11B 5/84* (2013.01); *G11B 25/043* (2013.01); *G11B 33/121* (2013.01); *G11B 33/1446* (2013.01); *H05K 5/04* (2013.01)

(58) Field of Classification Search
CPC ..... G11B 33/121; G11B 33/1446; H05K 5/04
USPC .................... 360/99.16; 361/679.31, 679.33
See application file for complete search history.

(56) References Cited

U.S. PATENT DOCUMENTS

| 8,089,721 | B1* | 1/2012 | Andrikowich ..... G11B 33/1466 310/67 R |
|---|---|---|---|
| 2010/0183869 | A1* | 7/2010 | Lin ........................ B22D 17/00 428/332 |
| 2013/0050873 | A1* | 2/2013 | Abe ........................ H02K 1/146 360/99.08 |
| 2013/0335859 | A1* | 12/2013 | Tatsumi ................. G11B 33/02 360/99.08 |
| 2014/0134453 | A1* | 5/2014 | Wu ......................... B32B 15/01 428/614 |
| 2015/0138670 | A1* | 5/2015 | Sato ......................... H02K 3/50 360/99.08 |

(Continued)

FOREIGN PATENT DOCUMENTS

JP 2007-280555 A 10/2007

*Primary Examiner* — Jefferson A Evans
(74) *Attorney, Agent, or Firm* — Keating & Bennett, LLP

(57) ABSTRACT

A base plate is arranged to define a portion of a housing of a hard disk drive, and includes a base body defined by casting, and an electrodeposition coating film arranged to cover a surface of the base body. The surface of the base body includes a coated surface covered with the electrodeposition coating film, and a flat worked surface exposed from the electrodeposition coating film. The worked surface may include a gate position to which a gate has been connected at the time of the casting. At least a portion of the worked surface is covered with an impregnant.

12 Claims, 12 Drawing Sheets

(56) References Cited

U.S. PATENT DOCUMENTS

| | | | |
|---|---|---|---|
| 2015/0235667 A1* | 8/2015 | Sugiki | G11B 19/2036 384/120 |
| 2016/0163349 A1* | 6/2016 | Yawata | G11B 19/2009 219/121.85 |
| 2016/0164365 A1* | 6/2016 | Yoneda | H02K 5/10 310/71 |
| 2017/0038641 A1* | 2/2017 | Yamazaki | G02F 1/133555 |
| 2018/0038309 A1* | 2/2018 | Sasaki | F02F 3/10 |
| 2018/0123413 A1* | 5/2018 | Akahori | G11B 19/2036 |

* cited by examiner

BASE PLATE, HARD DISK DRIVE, AND METHOD OF MANUFACTURING BASE PLATE

CROSS REFERENCE TO RELATED APPLICATIONS

This application claims the benefit of priority to Japanese Patent Application No. 2017-181974 filed on Sep. 22, 2017. The entire contents of this application are hereby incorporated herein by reference.

BACKGROUND OF THE INVENTION

1. Field of the Invention

The present invention relates to a base plate, a hard disk drive, and a method of manufacturing the base plate.

2. Description of the Related Art

A disk drive apparatus, such as, for example, a hard disk drive, has been known. The disk drive apparatus is typically arranged to realize high-speed access to a desired location on a disk while rotating the disk at a high speed. Meanwhile, high-speed rotation of the disk causes problems of noise, an increase in a power consumption due to windage, etc. Thus, a technique of filling an interior space of a disk device with a gas having a density lower than that of air, such as, for example, a helium gas, to achieve a reduced windage loss has been known. An enclosed magnetic disk device filled with a low-density gas, such as, for example, a helium gas, is described in, for example, JP-A 2007-280555.

A base of the disk device described in JP-A 2007-280555 is molded by an aluminum die casting process. In the molding by the die casting process, a molten metal is poured into a cavity in a pair of molds fitted to each other, and is hardened therein, and then, the molds are removed from the hardened metal to complete the molded base. A gate through which the molten metal is poured into the cavity, an overflow through which an air bubble is removed from the cavity, or the like is defined at a boundary between the pair of molds fitted to each other.

In the molding of the base, when the molten metal is hardened, a portion of the molten metal which remains in the gate or the overflow is also hardened. Then, a cast portion molded in the gate or the overflow together with the casting of the base. The cast portion in the gate or the overflow is cut off from the base, and a surface of the base from which the cast portion has been cut off has a low metal density. The low metal density may make it difficult to maintain airtightness of an interior space of a housing using the base.

SUMMARY OF THE INVENTION

In view of the above problem, the present invention has been conceived to provide a base plate, a hard disk drive, and a method of manufacturing the base plate which are able to achieve an improvement in airtightness of an interior space of a housing using the base plate.

A base plate according to a preferred embodiment of the present invention is arranged to define a portion of a housing of a hard disk drive. The base plate includes a base body defined by casting, an electrodeposition coating film arranged to cover a surface of the base body, and an impregnant. The surface of the base body includes a coated surface covered with the electrodeposition coating film, and a flat worked surface exposed from the electrodeposition coating film. The impregnant is arranged to cover at least a portion of the worked surface.

According to the above preferred embodiment of the present invention, when the surface of the base body includes a portion having a low metal density, this portion is covered with the impregnant in place of the electrodeposition coating film. This leads to an improvement in airtightness of an interior space of the housing. In particular, the worked surface can be satisfactorily impregnated with the impregnant because minute cavities in the base body are exposed to an outside at the worked surface.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
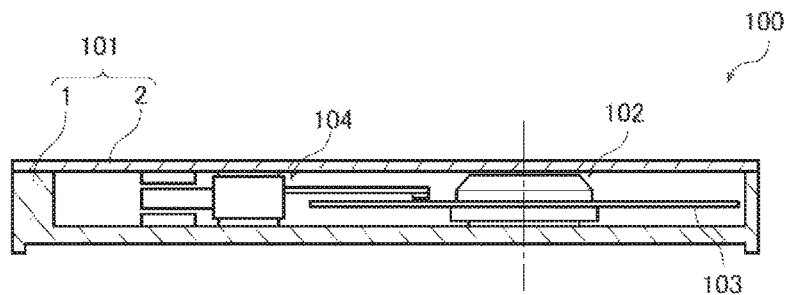
FIG. 1 is a sectional view of a disk drive apparatus according to a preferred embodiment of the present invention.

FIG. 1 is a sectional view of a disk drive apparatus 100 according to a preferred embodiment of the present invention.

The disk drive apparatus 100 is a hard disk drive. The disk drive apparatus 100 includes a housing 101, a spindle motor 102, a disk 103, and an access portion 104. The spindle motor 102, the disk 103, and the access portion 104 are housed in the housing 101.

The spindle motor 102 is supported by a base plate 1 of the housing 101. The base plate 1 will be described below. The spindle motor 102 is arranged to rotate the disk 103 while holding the disk 103. The disk 103 is a medium on which information is recorded. The access portion 104 is arranged to make an approach to a surface of the disk 103 to magnetically perform at least one of reading of information recorded on the disk 103 and writing of information to the disk 103.

The housing 101 includes the base plate 1 and a cover 2. The base plate 1 includes an opening, and the cover 2 is fitted to the opening to define the housing 101 together with the base plate 1. The base plate 1 and the cover 2 are combined so as to maintain airtightness of an interior space of the housing 101. The interior space of the housing 101 is filled with a gas having a density lower than that of air, e.g., a helium gas. Note that the interior space of the housing 101 may alternatively be filled with a hydrogen gas, air, or the like.

Figure 2:
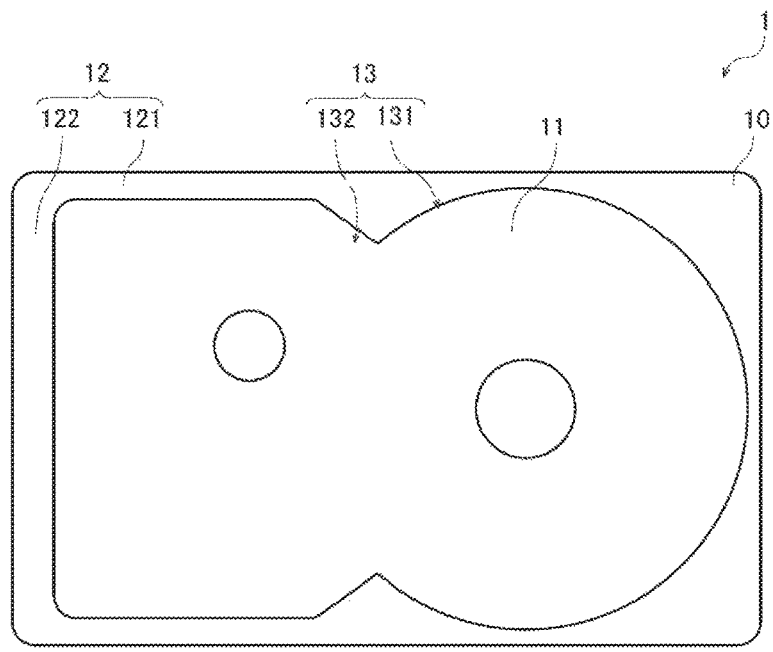
FIG. 2 is a top view of a base plate according to a preferred embodiment of the present invention.
Figure 3:
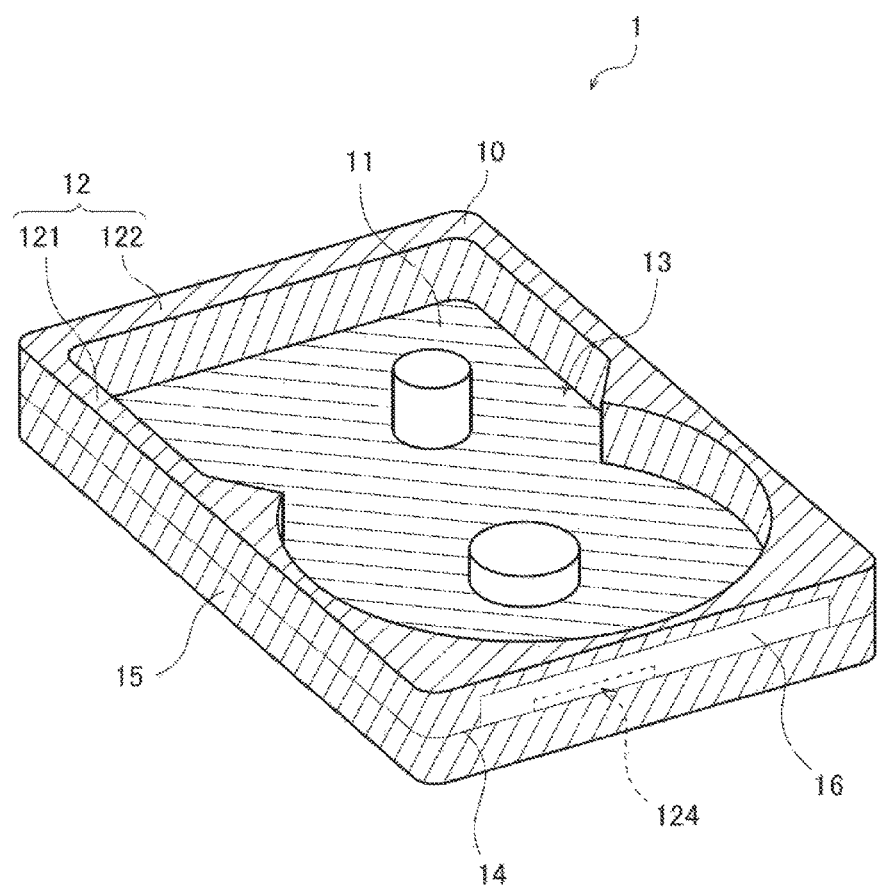
FIG. 3 is a perspective view of the base plate.

FIG. 2 is a top view of the base plate 1. FIG. 3 is a perspective view of the base plate 1.

The base plate 1 includes a base body 10. The base body 10 is a casting, and is defined by casting in a process of manufacturing the base plate 1, which will be described below. The base body 10 includes a rectangular bottom plate portion 11 and a wall portion 12 arranged to extend from an edge portion of the bottom plate portion 11 perpendicularly to the bottom plate portion 11. The edge portion of the bottom plate portion 11 is rectangular, and has long sides and short sides each of which is shorter than each of the long sides. The wall portion 12 includes long-side wall portions 121 each of which is arranged to extend from a separate one of the long sides of the edge portion of the bottom plate portion 11, and short-side wall portions 122 each of which is arranged to extend from a separate one of the short sides of the edge portion of the bottom plate portion 11.

The base body 10 has a space 13 surrounded by the bottom plate portion 11 and the wall portion 12. The space 13 includes a motor accommodating portion 131 and an access portion accommodating portion 132. The spindle motor 102 and the disk 103 are accommodated in the motor accommodating portion 131. The access portion 104 is accommodated in the access portion accommodating portion 132.

An outside surface of the wall portion 12 includes a parting line 14 extending along long sides and short sides thereof. The parting line 14 is a mark of a boundary between a pair of molds used at the time of the casting, which will be described below.

A surface of the base body 10 includes a coated surface 15, which is indicated by hatching in FIG. 3, and a worked surface 16.

The coated surface 15 is a surface of the base body 10 which is covered with an electrodeposition coating film 34. The electrodeposition coating film 34 is, for example, an insulating film made of an epoxy resin. The worked surface 16 is a surface of the base body 10 which is exposed from the electrodeposition coating film 34 and at least a portion of which is covered with an impregnant 36. The impregnant 36 is, for example, an epoxy resin. The worked surface 16 is defined by covering a portion of the surface of the base body 10 which has a low metal density with the impregnant 36 at the time of the casting, which will be described below. Minute cavities in the worked surface 16 are sealed by being covered with the impregnant 36. This results in an improvement in the airtightness of the interior space of the housing 101, which is defined by the base plate 1 and the cover 2.

The worked surface 16 is flat. The worked surface 16 is defined in an outside surface of one of the short-side wall portions 122. In addition, the worked surface 16 is arranged to extend along the parting line 14 on an opposite side of the parting line 14 with respect to the bottom plate portion 11. Further, the worked surface 16 is defined at a position to which a gate has been connected at the time of the casting, which will be described below. In other words, the worked surface 16 includes a gate position 124 to which the gate has been connected at the time of the casting, which will be described below. The gate position 124 is arranged to extend along the parting line 14 on the opposite side of the parting line 14 with respect to the bottom plate portion 11.

Figure 4:
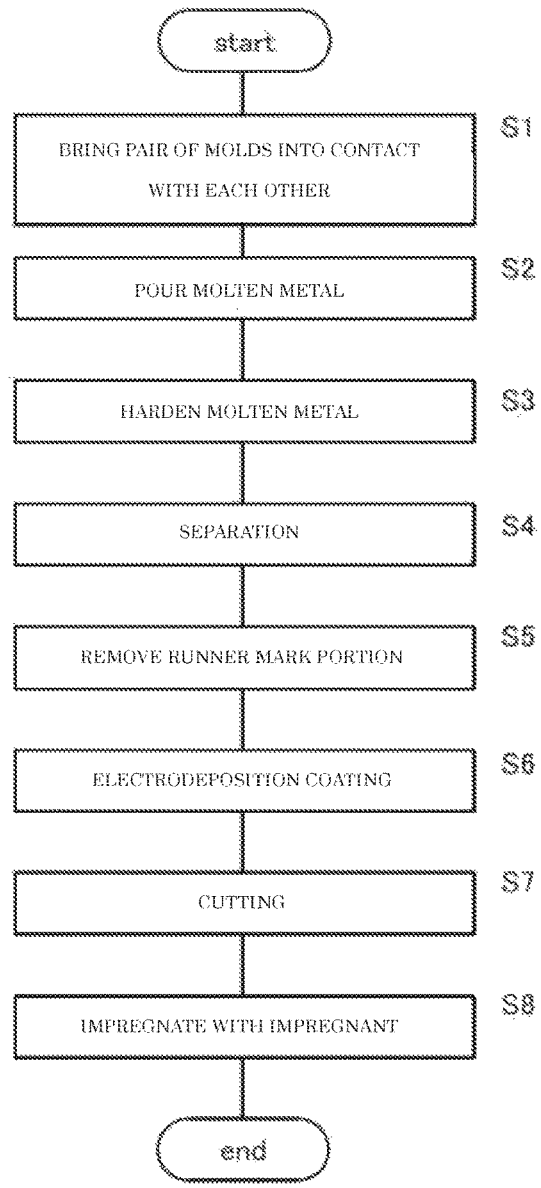
FIG. 4 is a flowchart illustrating a process of manufacturing the base plate according to a preferred embodiment of the present invention.

FIG. 4 is a flowchart illustrating the process of manufacturing the base plate 1. Each of FIGS. 5 and 6 is a vertical sectional view illustrating how the casting is performed.

Figure 5:
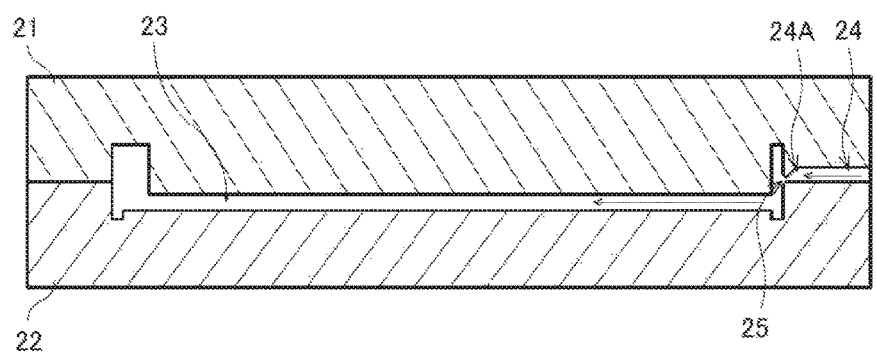
FIG. 5 is a vertical sectional view illustrating how casting is performed according to a preferred embodiment of the present invention.
Figure 6:
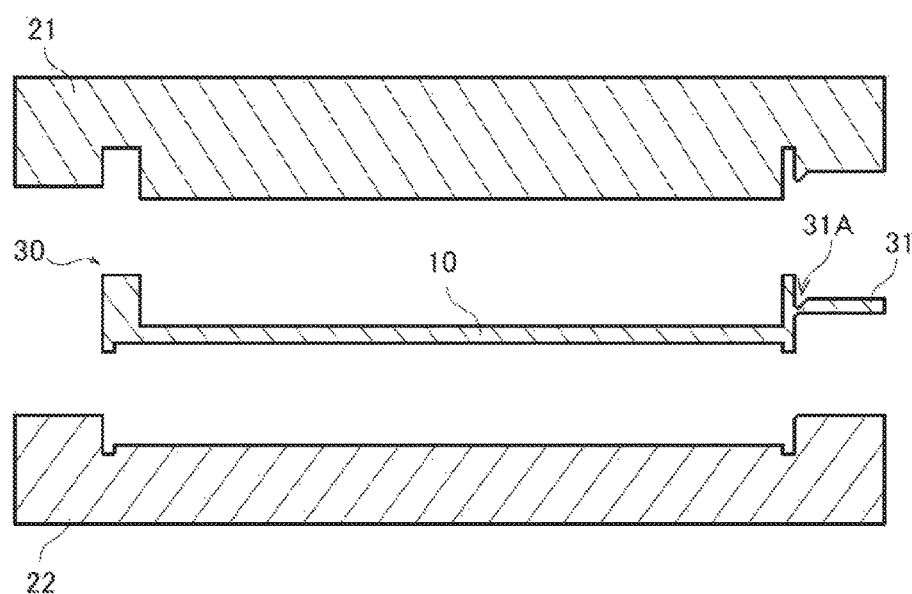
FIG. 6 is a vertical sectional view illustrating how the casting is performed according to a preferred embodiment of the present invention.

First, as illustrated in FIG. 5, opposed surfaces of a pair of molds 21 and 22 are brought into contact with each other to define a cavity 23 (step S1). The cavity 23 is arranged to have a shape corresponding to the shape of the base body 10. In addition, once the pair of molds 21 and 22 are brought into contact with each other, a runner 24 extending along the opposed surfaces of the molds 21 and 22 is defined at the boundary between the molds 21 and 22.

The runner 24 is a channel for a molten metal arranged to bring a space outside of the molds 21 and 22 into communication with the cavity 23. The runner 24 includes, at a junction with the cavity 23, a neck portion 24A arranged to first gradually decrease and then increase in opening size with decreasing distance from the cavity 23. Hereinafter, an opening portion of the runner 24 which is joined to the cavity 23 will be referred to as a gate 25.

Next, the molten metal is poured into the defined cavity (step S2). The molten metal is, for example, molten aluminum. At step S2, the molten metal is poured into the cavity 23 through the runner 24 and the gate 25 as indicated by arrows in FIG. 5. Although not shown in the figure, at the boundary between the molds 21 and 22, a runner other than the runner 24 is defined along the opposed surfaces of the molds 21 and 22. Once the molten metal is poured into the cavity 23, the molten metal including gas or the like or air in the cavity 23 is pushed out of the cavity 23 into the runner that is not shown. This allows the molten metal having a high quality to spread throughout the cavity 23. An opening at a junction between the runner that is not shown and the cavity 23 is an example of an "overflow" of the present application.

After the molten metal spreads throughout the cavity 23, the molten metal is cooled and hardened (step S3). Once the molten metal is hardened, a base workpiece 30, which will be described with reference to FIG. 6, is defined. Thereafter, the pair of molds 21 and 22 are opened, and the base workpiece 30 is separated from the molds 21 and 22 (step S4).

Figure 7:
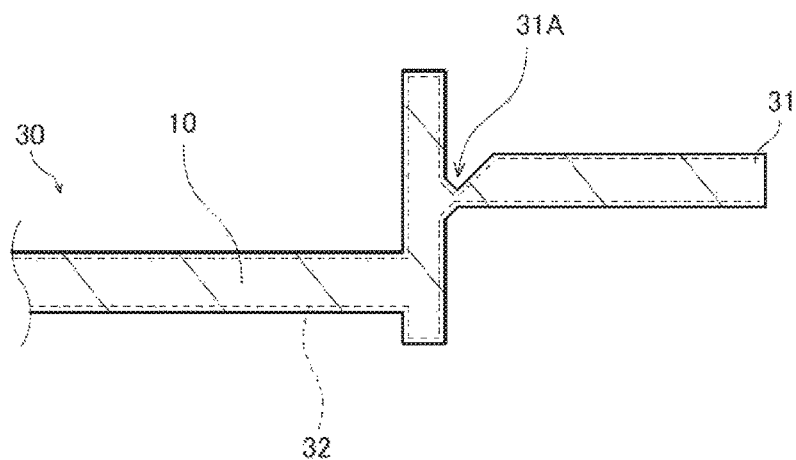
FIG. 7 is a diagram illustrating a section of a portion of a base workpiece separated from molds according to a preferred embodiment of the present invention in an enlarged form.

FIG. 7 is a diagram illustrating a section of a portion of the base workpiece 30 separated from the molds 21 and 22 in an enlarged form.

The base workpiece 30 includes the base body 10 and a runner mark portion 31 positioned outside of the surface of the base body 10. The runner mark portion 31 is a cast portion resulting from a portion of the molten metal staying in the runner 24 being hardened when the molten metal is hardened. The runner mark portion 31 includes a narrow portion 31A defined by the neck portion 24A.

In addition, a chill layer 32, which is indicated by a broken line in FIG. 7, is defined on a surface of the base workpiece 30. The chill layer 32 is defined where the molten metal is in contact with the molds 21 and 22 and is hardened more quickly than in other places. The chill layer 32, where the molten metal was hardened more quickly than in other places, contains fewer impurities and has a higher metal density than a remaining portion of the base workpiece 30. Accordingly, the chill layer 32 defined on the surface of the base body 10 leads to an improvement in the airtightness of the interior space of the housing 101.

Next, the runner mark portion 31 is removed from the base body 10 (step S5). At this time, the runner mark portion 31 is cut at the narrow portion 31A to be removed from the base body 10.

Figure 8:
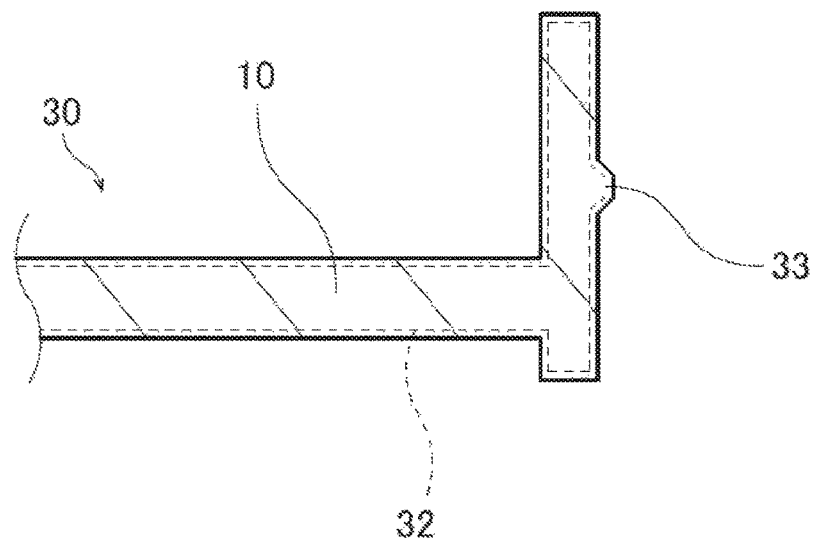
FIG. 8 is a diagram illustrating a section of a portion of the base body with a runner mark portion removed therefrom according to a preferred embodiment of the present invention in an enlarged form.

FIG. 8 is a diagram illustrating a section of a portion of the base body 10 with the runner mark portion 31 removed therefrom in an enlarged form. A projection 33 is defined in the surface of the base body 10 as a result of the runner mark portion 31 being cut at the narrow portion 31A. The position of the projection 33 corresponds to the gate position 124.

Figure 9:
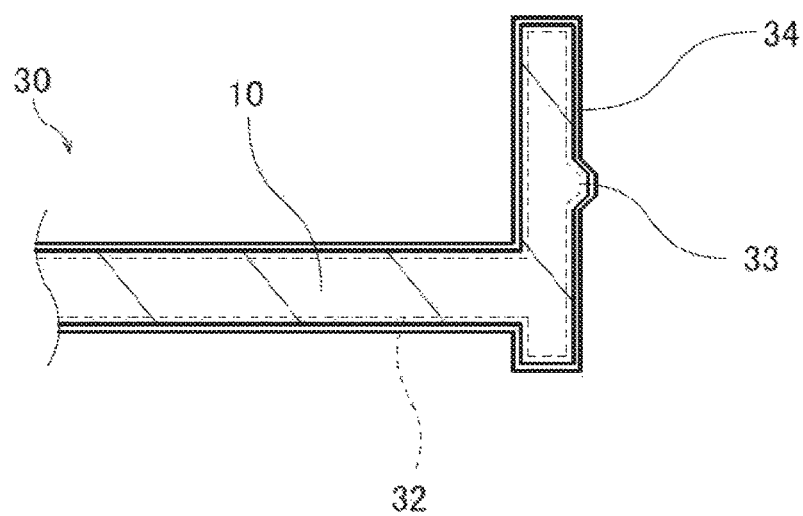
FIG. 9 is a diagram illustrating a section of a portion of the base body after being subjected to electrodeposition coating according to a preferred embodiment of the present invention in an enlarged form.

Thereafter, the surface of the base body 10 is subjected to electrodeposition coating (step S6). FIG. 9 is a diagram illustrating a section of a portion of the base body 10 after being subjected to the electrodeposition coating in an enlarged form. At this time, the base body 10 is, for example, immersed in a coating material, e.g., an epoxy resin, and an electric current is passed between the coating material and the base body 10 to adhere the coating material to the surface of the base body 10. As a result, the electrodeposition coating film 34 is defined on the surface of the base body 10.

Figure 10:
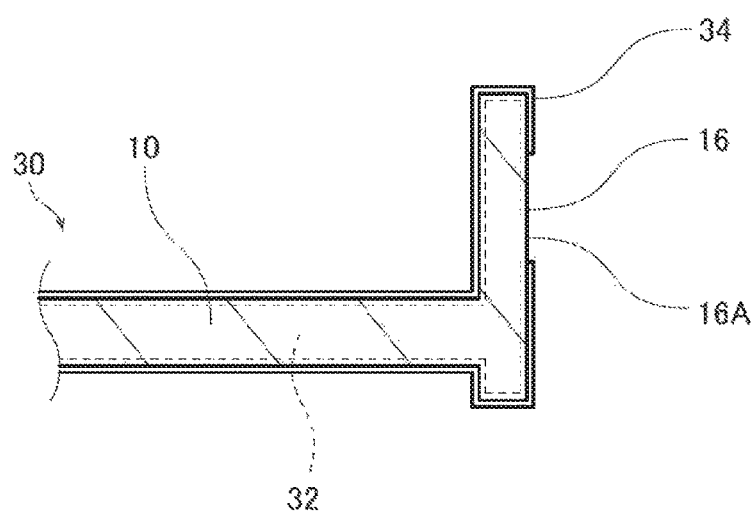
FIG. 10 is a diagram illustrating a section of a portion of the base body after being subjected to a cutting process according to a preferred embodiment of the present invention in an enlarged form.

Next, a portion of the surface of the base body 10 which is required to have a particularly high degree of accuracy, and which includes the projection 33, is subjected to a cutting process (step S7). FIG. 10 is a diagram illustrating a section of a portion of the base body 10 after being subjected to the cutting process in an enlarged form. At step S7, a portion of the surface of the base body 10, the portion including the position of the projection 33, and a portion of the electrodeposition coating film 34 which is defined on that portion, are removed by the cutting process to define the flat worked surface 16.

The chill layer 32 is defined on the surface of the base body 10, which is in contact with the molds 21 and 22. Therefore, a region 16A from which the projection 33 has been cut off has no chill layer 32 defined thereon. That is, immediately after the cutting process, the worked surface 16 is a surface of the base body 10 which is exposed from the electrodeposition coating film 34 and which includes the region 16A on which no chill layer 32 is defined.

Figure 11:
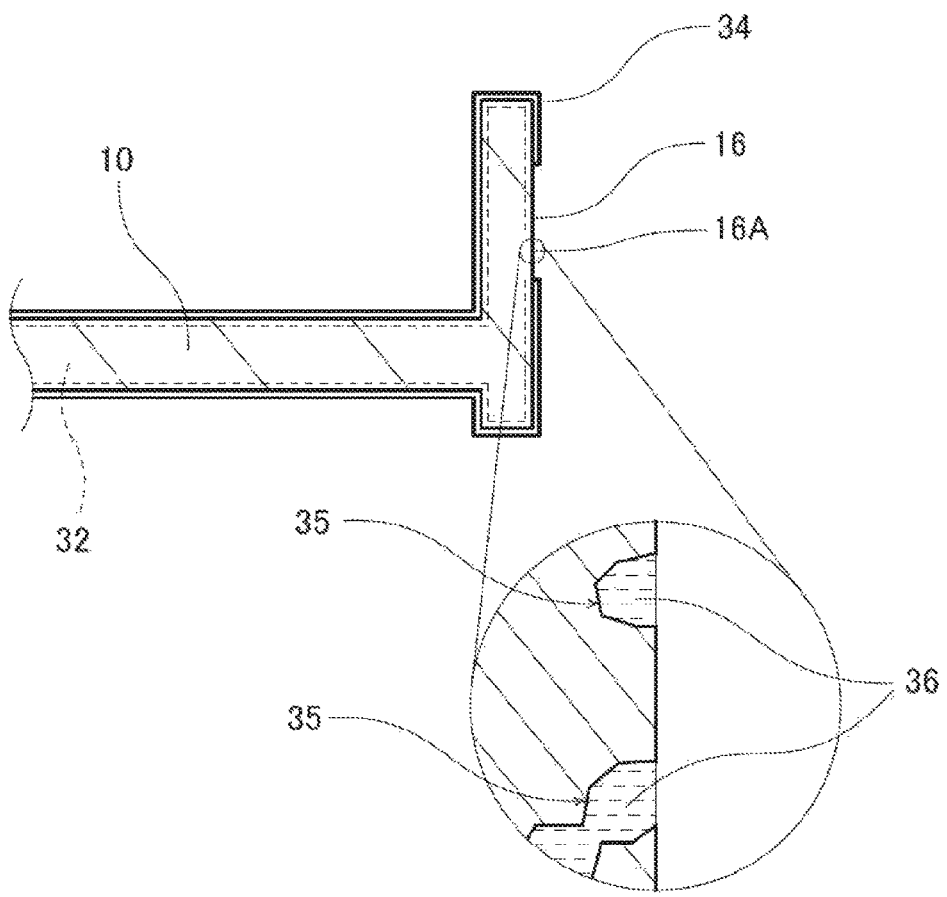
FIG. 11 is a diagram illustrating a section of a portion of the base body after being impregnated with an impregnant according to a preferred embodiment of the present invention in an enlarged form.

Next, the surface of the base body 10, with the worked surface 16 defined therein, is impregnated with the impregnant 36 (step S8). FIG. 11 is a diagram illustrating a section of a portion of the base body 10 after being impregnated with the impregnant 36 in an enlarged form. The impregnant 36 is, for example, an epoxy resin, and has a viscosity lower than that of the material of the electrodeposition coating film 34 before being hardened. At step S8, the base body 10 is immersed in the impregnant 36.

Here, when the base body 10 is cast, minute cavities are defined in the base body 10. The electrodeposition coating film 34 is provided on a remaining portion of the surface of the base body 10 excluding the worked surface 16, that is, the coated surface 15 illustrated in FIG. 3, and contributes to preventing air from penetrating the coated surface 15, that is, contributes to maintaining the airtightness of the interior space of the housing 101.

Meanwhile, the worked surface 16 includes the region 16A on which no chill layer 32 is defined. Therefore, the worked surface 16 has a low metal density. Specifically, the worked surface 16 has minute cavities 35 as illustrated in FIG. 11. These cavities 35 are defined when the base body 10 is cast. As a result of the immersion of the base body 10 in the impregnant 36 at step S8, the impregnant 36 infiltrates the cavities 35. At this time, because the electrodeposition coating film 34 has been cut off from the worked surface 16, the impregnant 36 is able to satisfactorily infiltrate the cavities 35 without the infiltration of the impregnant 36 into the cavities 35 being hindered by the electrodeposition coating film 34. In addition, when any cavity exists in a region of the worked surface 16 other than the region 16A, the impregnant 36 infiltrates that cavity as well. Thus, the impregnant 36 contributes to preventing air from penetrating the worked surface 16, and maintaining the airtightness of the interior space of the housing 101.

After the base body 10 is impregnated with the impregnant 36, the base body 10 is cleaned and is dried by heating, so that manufacture of the base plate 1 is completed. At this time, the impregnant 36 which has permeated the electrodeposition coating film 34 is washed away when the base body 10 is cleaned, but if any minute cavity exists in the electrodeposition coating film 34, the impregnant 36 will remain in that cavity.

As described above, when the surface of the base body 10 includes a portion having a low metal density, this portion is covered with the impregnant 36 in place of the electrodeposition coating film 34. This leads to an improvement in the airtightness of the interior space of the housing 101. In particular, the worked surface 16 can be satisfactorily impregnated with the impregnant 36 because the minute cavities 35 in the base body 10 are exposed to the outside at the worked surface 16.

While a preferred embodiment of the present invention has been described above, it is to be understood that the present invention is not limited to the above-described preferred embodiment.

In the above-described preferred embodiment, the worked surface 16 is provided at a position including the gate position 124. Note, however, that the worked surface 16 may also be provided at a position including the position of an overflow. The position of the overflow refers to a position to which the runner for removing air or the molten metal from the cavity 23 has been connected at the time of the casting.

Also note that the positions of the worked surface 16 and the gate position 124 are not limited to the positions according to the above-described preferred embodiment, but may be modified appropriately. For example, the worked surface 16 is defined in the outside surface of one of the short-side wall portions 122 in the present preferred embodiment, but may alternatively be defined in an outside surface of one of the long-side wall portions 121. Also note that the number of gate positions 124 may be more than one. Also note that the worked surface 16 may be arranged to have any desirable size.

Each of FIGS. 12, 13, 14, and 15 is a perspective view of a base plate according to a modification of the above-described preferred embodiment.

Figure 12:
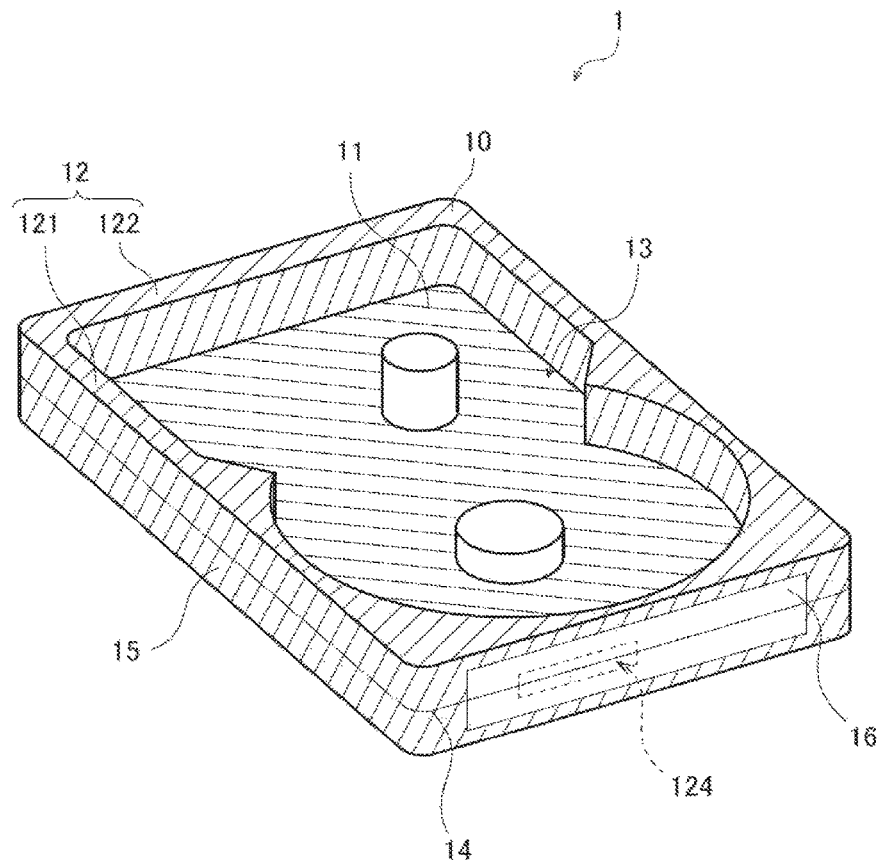
FIG. 12 is a perspective view of a base plate according to a modification of the above preferred embodiment of the present invention.

In the modification illustrated in FIG. 12, the worked surface 16 is defined in the outside surface of one of the short-side wall portions 122. In addition, the worked surface 61 is arranged to extend along the parting line 14 on both sides of the parting line 14. The gate position 124 is arranged to extend along the parting line 14 on both sides of the parting line 14.

Figure 13:
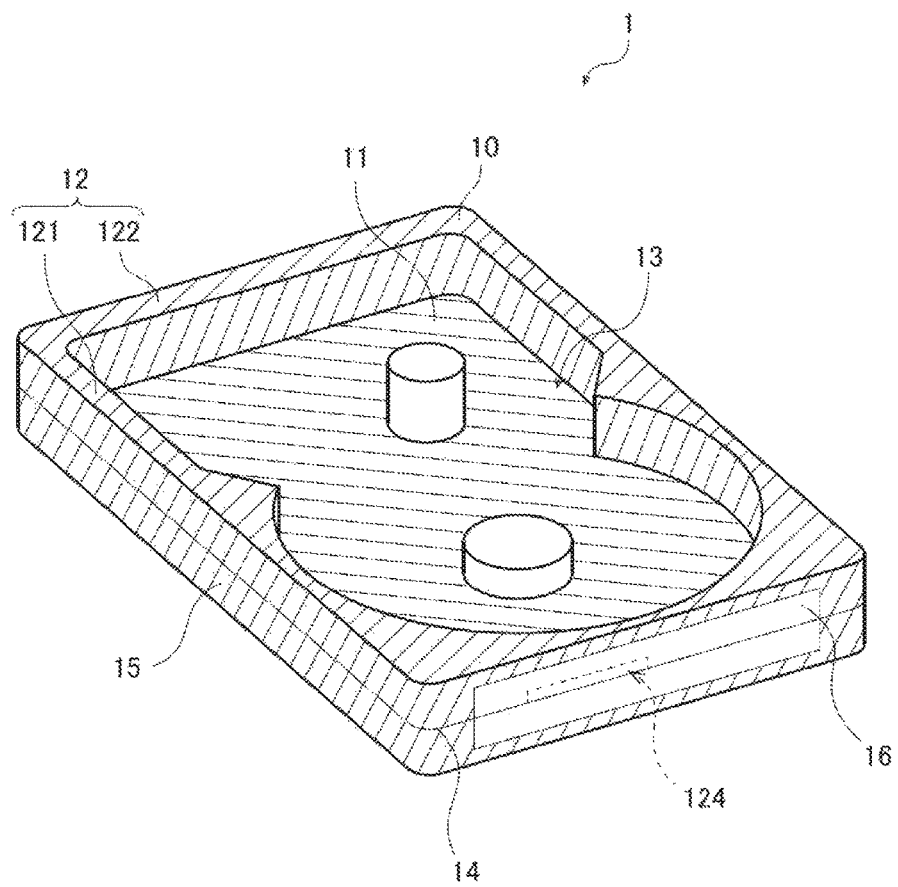
FIG. 13 is a perspective view of a base plate according to a modification of the above preferred embodiment of the present invention.

In the modification illustrated in FIG. 13, the worked surface 16 is defined in the outside surface of one of the short-side wall portions 122. In addition, the worked surface 61 is arranged to extend along the parting line 14 on both sides of the parting line 14. The gate position 124 is arranged to extend along the parting line 14 on the opposite side of the parting line 14 with respect to the bottom plate portion 11.

Figure 14:
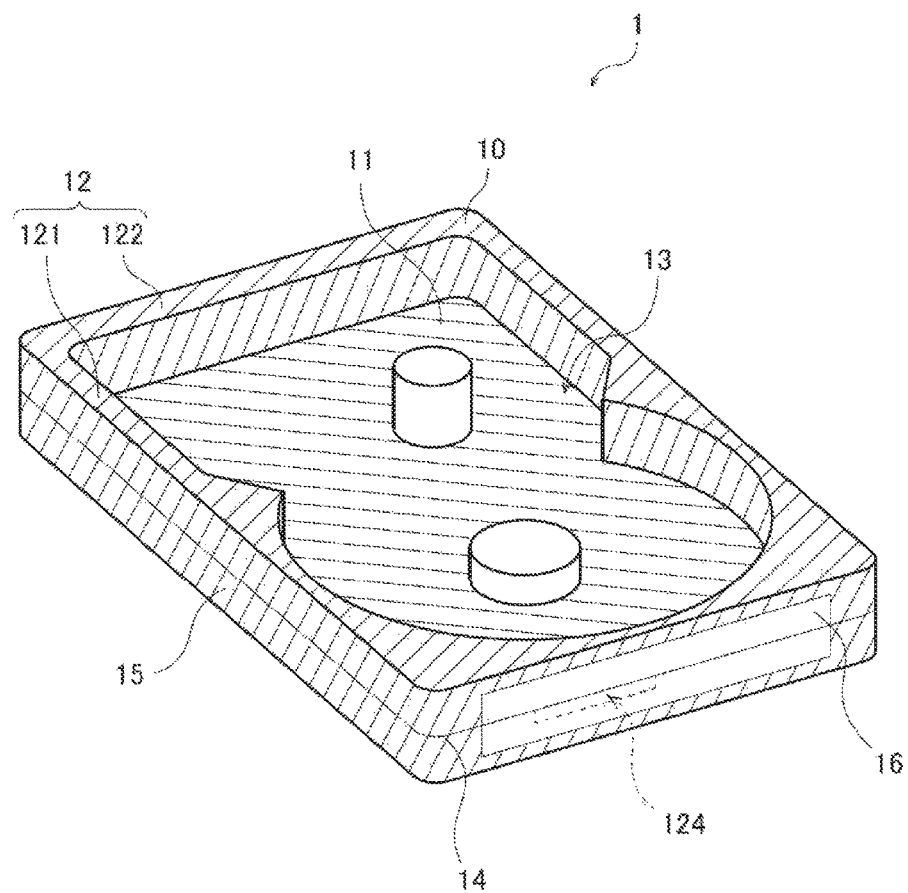
FIG. 14 is a perspective view of a base plate according to a modification of the above preferred embodiment of the present invention.

In the modification illustrated in FIG. 14, the worked surface 16 is defined in the outside surface of one of the short-side wall portions 122. In addition, the worked surface 61 is arranged to extend along the parting line 14 on both sides of the parting line 14. The gate position 124 is arranged to extend along the parting line 14 on a side of the parting line 14 on which the bottom plate portion 11 lies.

Figure 15:
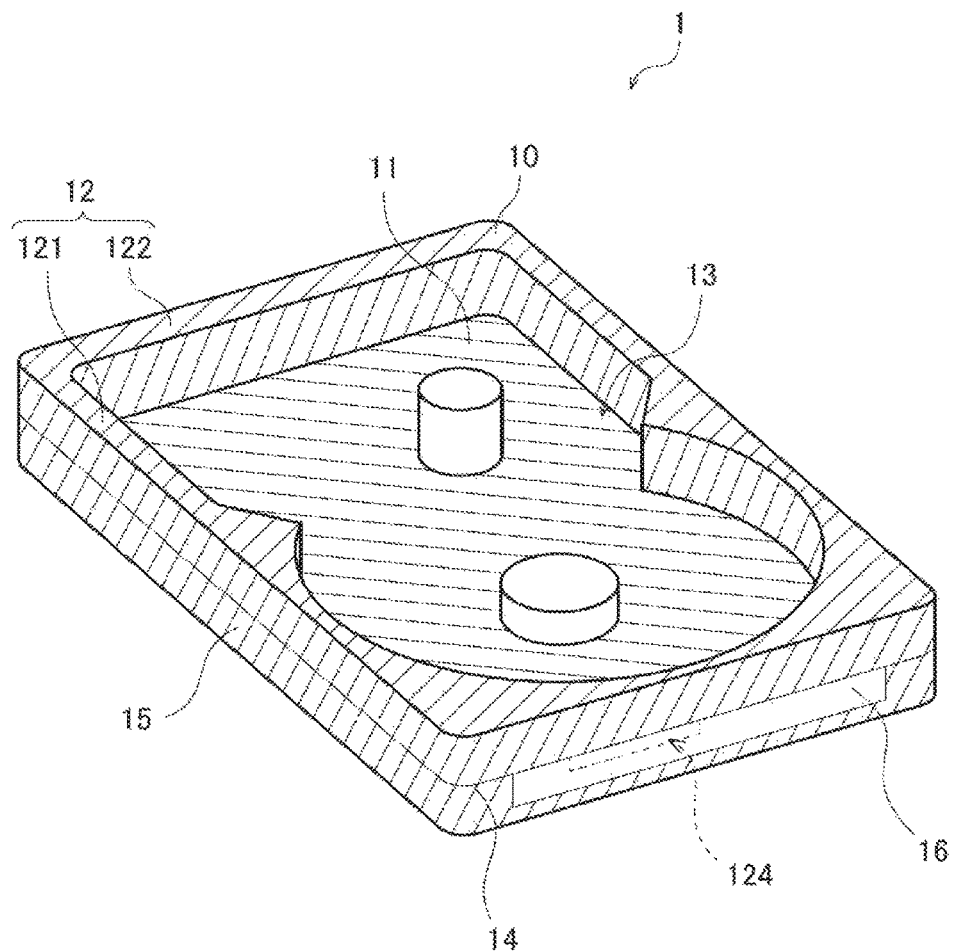
FIG. 15 is a perspective view of a base plate according to a modification of the above preferred embodiment of the present invention.

In the modification illustrated in FIG. 15, the worked surface 16 is defined in the outside surface of one of the short-side wall portions 122. In addition, the worked surface 61 is arranged to extend along the parting line 14 on the side of the parting line 14 on which the bottom plate portion 11 lies. The gate position 124 is arranged to extend along the parting line 14 on the side of the parting line 14 on which the bottom plate portion 11 lies.

While a preferred embodiment of the present invention and several modifications thereof have been described above, it should be noted that features of the above-described preferred embodiment and the modifications thereof may be combined appropriately as long as no conflict arises.

Preferred embodiments of the present invention are applicable to, for example, base plates, hard disk drives, and methods of manufacturing the base plates.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A base plate arranged to define a portion of a housing of a hard disk drive, the base plate comprising:
a base body defined by casting;
an electrodeposition coating film arranged to cover an external surface of the base body; and
an impregnant; wherein
the external surface of the base body includes:
a coated surface covered with the electrodeposition coating film; and
a worked surface exposed from and encircled by the electrodeposition coating film, the worked surface including at least one minute cavity defined therein; and
the impregnant is arranged to cover at least a portion of the worked surface, and infiltrates into the at least one minute cavity.

2. The base plate according to claim 1, wherein the worked surface includes at least one of a gate position to which a gate has been connected at a time of the casting, and a position of an overflow.

3. The base plate according to claim 1, wherein
the base body includes:
a rectangular bottom plate portion; and
a wall portion arranged to extend from an edge portion of the bottom plate portion perpendicularly to the bottom plate portion; and
the worked surface is defined in an outside surface of the wall portion.

4. The base plate according to claim 3, wherein
the base body further includes a parting line being a mark of a boundary between a pair of molds used at the time of the casting; and
the worked surface is arranged to extend along the parting line on an opposite side of the parting line with respect to the bottom plate portion.

5. The base plate according to claim 4, wherein
a material of the electrodeposition coating film is a resin; and
the impregnant is a resin having a viscosity lower than that of the material of the electrodeposition coating film before being hardened.

6. The base plate according to claim 5, wherein each of the material of the electrodeposition coating film and the impregnant is an epoxy resin.

7. A hard disk drive comprising:
the base plate of claim 1;
a cover arranged to define the housing together with the base plate;
a spindle motor supported by the base plate; and
a disk caused by the spindle motor to rotate in the housing.

8. The hard disk drive according to claim 7, wherein an interior space of the housing is filled with a gas having a density lower than that of air.

9. A base plate arranged to define a portion of a housing of a hard disk drive, the base plate comprising:
a base body defined by casting;
an electrodeposition coating film arranged to cover a surface of the base body; and
an impregnant; wherein
the surface of the base body includes:
a coated surface covered with the electrodeposition coating film; and
a flat worked surface exposed from the electrodeposition coating film; and
the impregnant is arranged to cover at least a portion of the worked surface;
the base body includes:
a rectangular bottom plate portion; and
a wall portion arranged to extend from an edge portion of the bottom plate portion perpendicularly to the bottom plate portion; and
the worked surface is defined in an outside surface of the wall portion;
the edge portion of the bottom plate portion is rectangular, and has long sides and short sides;
the wall portion includes:
long-side wall portions each of which is arranged to extend from a separate one of the long sides; and
short-side wall portions each of which is arranged to extend from a separate one of the short sides; and the worked surface is defined in an outside surface of one of the short-side wall portions.

10. A method of manufacturing a base plate arranged to define a portion of a housing of a hard disk drive, the method comprising the steps of:
   a) defining a base body by casting;
   b) defining an electrodeposition coating film on a surface of the base body;
   c) removing a portion of the surface of the base body and a portion of the electrodeposition coating film which is defined on that portion by a cutting process to define a worked surface encircled by the electrodeposition coating film, the worked surface including at least one minute cavity defined therein; and
   d) impregnating at least a portion of the worked surface with an impregnant such that the impregnant infiltrates into the at least one minute cavity.

11. The method according to claim 10, wherein, in step c), of the surface of the base body, a projection defined at a gate of a mold at a time of the casting is removed by the cutting process.

12. The method according to claim 11, further comprising the step of e), between steps a) and b), removing a runner mark portion defined in a runner of the mold at the time of the casting from the base body; wherein
   the runner mark portion includes a narrow portion outside of the surface of the base body; and
   in step e), the narrow portion is cut to define the projection.

* * * * *